United States Patent
Juncker et al.

(10) Patent No.: US 6,538,449 B2
(45) Date of Patent: Mar. 25, 2003

(54) BATTERY LIFE ESTIMATION

(75) Inventors: Carsten Juncker, Lyngby (DK); Frank Knudsen Christensen, Vaerloese (DK)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/101,160

(22) Filed: Mar. 20, 2002

(65) Prior Publication Data

US 2003/0034779 A1 Feb. 20, 2003

(30) Foreign Application Priority Data

Mar. 21, 2001 (GB) .............................................. 0107086

(51) Int. Cl.[7] .............................................. G01N 27/416
(52) U.S. Cl. ........................................ 324/429; 324/430
(58) Field of Search ................................. 324/429, 430, 324/428, 426; 320/132, 134, 118, 164

(56) References Cited

U.S. PATENT DOCUMENTS 5,578,915 A * 11/1996 Crouch, Jr. et al. ......... 324/428
5,644,212 A * 7/1997 Takahashi ................... 320/134

* cited by examiner

*Primary Examiner*—Edward H. Tso
*Assistant Examiner*—Lawrence Luk
(74) *Attorney, Agent, or Firm*—Antonelli, Terry, Stout & Kraus, LLP

(57) ABSTRACT

Battery life estimation can be performed by using an algorithm and parameter values for the algorithm, scaled according to the type, e.g. capacity and chemistry, of the battery actually being used. The result of the algorithm may be scaled according to the expected current demand of the apparatus being powered by the battery. A parameter of the algorithm may also be varied if it fails to meet a predetermined fitness criterion during discharging of the battery.

65 Claims, 10 Drawing Sheets

BATTERY LIFE ESTIMATION

FIELD OF THE INVENTION

The present invention relates to the estimation of extant battery life for battery powered apparatus.

BACKGROUND TO THE INVENTION

Mobile telephones are an example of a battery-powered device familiar to most people. The extant battery life of battery-power devices, including mobile telephones, is of considerable importance to their users. Consequently, the provision of extant battery life indicators on mobile telephones is universal.

One method of determining the extant battery life of an apparatus, such as a mobile telephone, is to measure the battery voltage and then read an extant battery life value from a pre-programmed lookup table. This has the advantage of being relatively simple to implement but suffers from a lack of accuracy.

This problem is addressed in GB-A-2312517 which describes taking three voltage readings, fitting a discharge curve to the readings and then determining the extant battery life from the curve fitted to the readings. This approach is more accurate that the earlier lookup table technique. However, it is computationally intensive since the parameters of a formula for determining the battery discharge time to a specified voltage must be repeatedly calculated. It should be noted that these calculations are not trivial.

Some saving in computation can be made by storing pre-calculated values for the parameters of a battery discharge model formula. However, the calculation of these parameters requires lengthy discharge tests of many batteries having different chemistries and capacities for each of the characteristic operating currents of the device, e.g. idle and active modes of a mobile phone. The fact that it takes 18 days for a 900 mAh battery to discharge at a constant current of 2 mA gives some idea of the problem when one considers that the characteristic current may be constantly changing during the development of a product.

SUMMARY OF THE INVENTION

According to the present invention, there is provided a battery powered apparatus comprising a battery, a memory storing a set of parameter values appropriate for calculating a total life estimate of a reference battery according to an algorithm and processing means programmed to estimate the extant life of said battery of the apparatus by scaling at least one of said parameter values in dependence on the capacity of said battery of the apparatus and calculating a total life estimate for said battery of the apparatus using the or each scaled parameter value and said algorithm.

Thus, the apparatus does not need to be programmed with so many parameter values.

Preferably, said battery of the apparatus includes means identifying its capacity and the processing means comprises means for determining the capacity of said battery from said capacity identifying means. This means that a new battery can be introduced for the device after the end of its development.

Preferably, the processing means is programmed to implement said algorithm by calculating said total life estimate for the battery of the apparatus using the formula:

$$\frac{\ln\left(\frac{\varphi - V_{low}}{\zeta}\right)}{\ln \alpha}$$

where $\varphi$, $\zeta$ and $\alpha$ constitute parameters for which said default values are stored in the memory and $V_{low}$ is a battery voltage indicative of the battery of the apparatus approaching an empty state. More preferably, the processing means is programmed to scale the parameter $\alpha$ according the capacity of the battery by implementing the formula:

$$\alpha = \left[(\alpha_{default} - 1) \cdot \frac{C_{default}}{C_{new}}\right] + 1$$

where $C_{default}$ is the capacity of the reference battery and $C_{new}$ and the value of $\alpha_{default}$ being one of said default parameter values stored in the memory.

The reduction in the amount of battery testing that may be achieved is primarily a benefit for the manufacturing process.

According to the present invention, there is provided a method of manufacturing a battery powered apparatus having processing means, the method comprising:

discharging a battery at a constant current and recording the voltage across the battery as it discharges;

determining default parameter values for a battery discharge model for estimating total battery life from the recorded voltages; and programming said processing means with a program implementing said model and the values of said parameter values, wherein the programming means is programmed to scale the product of the application of said model in dependence on a current demand value dependent on said apparatus.

Preferably, a manufacturing method according to the present invention comprises:

discharging a battery, of the same type, at a further constant current and recording the voltage across the battery as it discharges;

determining further default parameter values for the battery discharge model for estimating total battery life from the recorded voltages for said further constant current discharge, wherein the model parameter values programmed into the processing means are selected from said determined default parameter values in dependence on said apparatus dependant current value.

According to the present invention, there is provided a method of manufacturing a plurality of different battery powered apparatuses having respective processing means and different current demands, the method comprising:

discharging a battery or a plurality of batteries of the same type at a plurality of different constant currents and recording the voltage across the or each battery as it discharges;

for each discharge current, determining default parameter values for a battery discharge model for estimating total battery life from the recorded voltages; and for each apparatus, programming its processing means with a program implementing said model and the default parameter values for the discharge current nearest to a respective apparatus dependent current demand value, wherein each programming means is programmed to scale the product of the application of said model in dependence on the relevant current demand value.

Preferably, in a manufacturing method according to the present invention, the parameters are for a model of the form:

$$\frac{\ln\left(\frac{\varphi - V_{low}}{\zeta}\right)}{\ln \alpha}$$

where $\varphi$, $\zeta$ and $\alpha$ constitute parameters for which said default values are stored in the memory and $V_{low}$ is a battery voltage indicative of the battery of the apparatus approaching an empty state. More preferably, said scaling comprises scaling the default value of the parameter $\alpha$, stored in the memory.

If the or each battery is a Li-ion battery, the or each processing means is preferably programmed to scale the default value of $\alpha$ according to the formula:

$$\alpha = \left[(\alpha_{default} - 1) \cdot \frac{I_{exp}}{I_{default}}\right] + 1$$

where $I_{exp}$ is said apparatus dependent current value and $I_{default}$ is the respective discharge current for which the parameter values, programmed into the or each apparatus, were determined.

If the or each battery is a NiMH battery, the or each processing means is preferably programmed to scale the default value of $\alpha$ according to the formula:

$$\alpha = \left[(\alpha_{default} - 1) \cdot \frac{I_{exp}}{I_{default} \cdot (1 - X)}\right] + 1$$

if the apparatus dependent current is greater than that relating to the programmed parameter value and according to the formula:

$$\alpha = \left[(\alpha_{default} - 1) \cdot \frac{I_{exp}}{I_{default} \cdot (1 + X)}\right] + 1$$

if the apparatus dependent current is less than that relating to the programmed parameter value,
where $I_{exp}$ is said apparatus dependent current value and $I_{default}$ is the respective discharge current for which the parameter values, programmed into the or each apparatus, were determined. Preferably, is about 0.05.

According to the present invention, there is also provided a battery powered apparatus comprising a battery and processing means configured for calculating an extant battery life estimate for the battery using a battery discharge model, wherein the product of the use of said model is scaled by the processing means in dependence on a current demand value for the apparatus.

Preferably, the model is of the form:

$$\frac{\ln\left(\frac{\varphi - V_{low}}{\zeta}\right)}{\ln \alpha}$$

and the processing means is programmed with default values for $\varphi$, $\zeta$, $\alpha$ and $V_{low}$ and the value for a used is derived from the programmed default value for $\alpha$ in dependence on said current demand value, and $V_{low}$ is a battery voltage indicative of the battery of the apparatus approaching an empty state.

If the battery is a Li-ion battery, the value of the parameter $\alpha$ used is preferably determined according to the formula:

$$\alpha = \left[(\alpha_{default} - 1) \cdot \frac{I_{exp}}{I_{default}}\right] + 1$$

where $I_{exp}$ is said apparatus dependent current value and $I_{default}$ is the respective discharge current for which the parameter values, programmed into the or each apparatus, were determined.

If the battery is a NiMH battery, the value of the parameter $\alpha$ used is preferably determined according to the formula:

$$\alpha = \left[(\alpha_{default} - 1) \cdot \frac{I_{exp}}{I_{default} \cdot (1 - X)}\right] + 1$$

where $I_{exp}$ is said apparatus dependent current value and $I_{default}$ is the respective discharge current for which the parameter values, programmed into the or each apparatus, were determined and is less than $I_{exp}$ and/or the value of the parameter $\alpha$ used is scaled according to the formula:

$$\alpha = \left[(\alpha_{default} - 1) \cdot \frac{I_{exp}}{I_{default} \cdot (1 + X)}\right] + 1$$

where $I_{exp}$ is said apparatus dependent current value and $I_{default}$ is the respective discharge current for which the parameter values, programmed into the or each apparatus, were determined and is greater than $I_{exp}$. Preferably, X is about 0.05.

According to the present invention, there is further provided a battery-powered apparatus including a battery voltage sensor for sensing the voltage of a battery powering the apparatus and processing means, wherein the processing means is configured to estimate the extant life of a battery powering the apparatus by:

using a battery voltage value, derived from the voltage measured by said sensor, and a battery discharge elapsed time value to determine whether the value of a dominating parameter of a function, derived from a model of a substantial part of the discharging of a battery, meets a fitness criterion; and if the value of said dominating parameter fails to meet said fitness criterion, modifying said dominating parameter's value in a predetermined manner and then calculating an estimate of extant battery life using said function. The modification of the dominating parameter has been found to be particularly useful for ensuring that the battery life estimates remain appropriate as a battery ages.

Preferably, the processing means is configured to modify the value of a further parameter of said function if said dominating parameter's value fails to meet said fitness criterion.

Preferably, the processing means is configured to generate said elapsed time value is by scaling a measured time value using a function of battery load current.

Preferably, the processing means is configured to select an expected load current value from a collection of load current values indexed by operating modes of the apparatus. An alternative would be to use a measured value.

Advantageously, said function is of the form:

$$t_r = \left( \frac{\ln \frac{\varphi - V_{low}}{\zeta}}{\ln \alpha} - t_{elap} \right)$$

where $t_r$ is the extant battery life value, $\phi$ is said dominating parameter, $\alpha$ and $\zeta$ are further parameters, $V_{low}$ is a battery voltage indicative of the battery approaching an empty state, and $_{elap}$ is said elapsed time value, and said model relates battery voltage to discharge time at constant current thus:

$$V_b = \phi - \zeta \alpha^{t_{elap}}.$$

and preferably, said fitness criterion is:

$$\Delta\phi_{acceptable} > V_b + \zeta\alpha^{t_{elap}} - \phi$$

where $V_b$ is the current battery voltage value. Preferably, $\Delta\phi_{acceptable}$ is in the range 0.04V to 0.06V, preferably 0.05V.

Said battery is preferably connected to said apparatus and may be, for example, a Li-ion or NiMH battery.

According to the present invention, there is further provided a mobile phone including a battery, a voltage sensor for measuring the voltage of the battery and a processor configured to control the mobile phone for operation in a standby mode and in a non-standby mode, the processor being further configured to estimate the extant life of said battery in said standby mode by an extant battery life estimating process comprising:

using a battery voltage value, derived from the voltage measured by said sensor, and a battery discharge elapsed time value to determine whether the value of a dominating parameter of a function, derived from a model of a substantial part of the discharging of a battery, meets a fitness criterion; and if the value of said dominating parameter fails to meet said fitness criterion, modifying said dominating parameter's value in a predetermined manner and calculating an estimate of extant battery life using said function.

Preferably, said function is of the form:

$$t_r = \left( \frac{\ln \frac{\varphi - V_{low}}{\zeta}}{\ln \alpha} - t_{elap} \right)$$

where $t_r$ is the extant battery life value, $\phi$ is said dominating parameter, $\alpha$ and $\zeta$ are further parameters, $V_{low}$ is a battery voltage indicative of the battery approaching an empty state, $t_{elap}$ is said elapsed time value, and said model relates battery voltage to discharge time at constant current thus:

$$V_b = \phi - \zeta\alpha^{t_{elap}}.$$

The mobile phone may employ parameter scaling in dependence on battery capacity according to the present invention, in which case said process comprises initially determining whether it is being run for a first time since the mobile phone was powered up and, if so, setting the value of at least one of said parameters in dependence on the capacity of the battery.

The mobile phone may employ parameter scaling in dependence on current demand according to the present invention, in which case the processor is configured to control the mobile phone to operate according to a plurality of communication protocols and said process comprises initially determining whether it is being run for a first time since the mobile phone was powered up and, if so, setting the value of the parameter $\alpha$ by scaling a default value according to the expected standby current demand for the communication protocol currently being used.

Preferably, said process comprises determining whether the mobile phone is in standby mode and, if so, performing a first routine otherwise performing a second routine.

Preferably, the first routine comprises:

updating $t_{elap}$;

determining that the battery is neither low nor high;

calculating $\Delta\phi$ where $\Delta\phi = V_b + \zeta\alpha^{t_{elap}} - \phi$;

determining whether this is the first time that standby mode has been entered and, if so, updating said parameters according to $$\varphi_{new} = \varphi_{old} + 0.1\Delta\varphi$$

$$\alpha_{new} = \alpha_{old} - \Delta\varphi \left[ \frac{\alpha_0 - 1}{\varphi_0} \right] \cdot 2$$

$$\zeta_{new} = \zeta_{old} + \Delta\varphi \left[ \frac{\zeta_0}{\varphi_0} \right] \cdot 2$$

else determining whether $\Delta\phi$ is greater then $\Delta\phi_{acceptable}$ and, if so updating said parameters according to $$\varphi_{new} = \varphi_{old} + \left[ \Delta\varphi - \frac{|\Delta\varphi|}{\Delta\varphi} \cdot \Delta\varphi_{acceptable} \right] \cdot \mu_\varphi$$

$$\alpha_{new} = \alpha_{old} - \Delta\varphi \cdot \mu_\alpha$$

$$\zeta_{new} = \zeta_{old} - \Delta\varphi \cdot \mu_\zeta;$$

and calculating $t_r$, wherein $\Delta\phi_{acceptable}$ and $\mu_\phi$ are predetermined and $\mu_\zeta$ and $\mu_\alpha$ are set according to $$\mu_\alpha = \left( \frac{\alpha_0 - 1}{\varphi_0} \right) \cdot 0.5$$

$$\mu_\zeta = \left( \frac{\zeta_0}{\varphi_0} \right) \cdot 0.5.$$

Preferably, the second routine comprises:

determining whether the battery voltage indicated a full battery when last measured and, if so estimating the prevailing load current on the basis of the current operational status, e.g. protocol, modulation method, PDA functions;

estimating the equivalent standby battery voltage for the present value of $t_{elap}$;

determining whether said equivalent standby battery voltage indicates a full battery and, if not:

updating updating $\phi$ according to $\phi_{new} = \phi_{old} + 0.5\Delta\phi$ with $\Delta\phi$ being derived using the equivalent standby battery voltage;

else
   estimating the load current according to $$I_{load} = \frac{[\varphi + \zeta a^{t_{elap}}] - V_b}{R_b}$$

where $R_b$ is an approximate value for the resistance of the battery and $V_b$ is the measured battery voltage;

calculating a value for said elapsed time value by calculating an incremental elapsed time value according to $$\Delta t_{elap} = \left(1 + \frac{I_{load}}{I_{min\_stby}}\right) \cdot \Delta t_{elap\_measured}$$

where $I_{min\_stby}$ is the minimum expected standby current;

calculating $t_r$.

In the present document, the term "full" when applied to a battery means a battery sufficiently charged that its voltage is above a threshold in the region of the battery's discharge characteristic where the transition from the initial rapidly dropping voltage to the more gently dropping voltage.

DETAILED DESCRIPTION OF THE PREFERRED EMBODIMENTS

Embodiments of the present invention will now be described, by way of example, with reference to the accompanying drawings.

Figure 1:
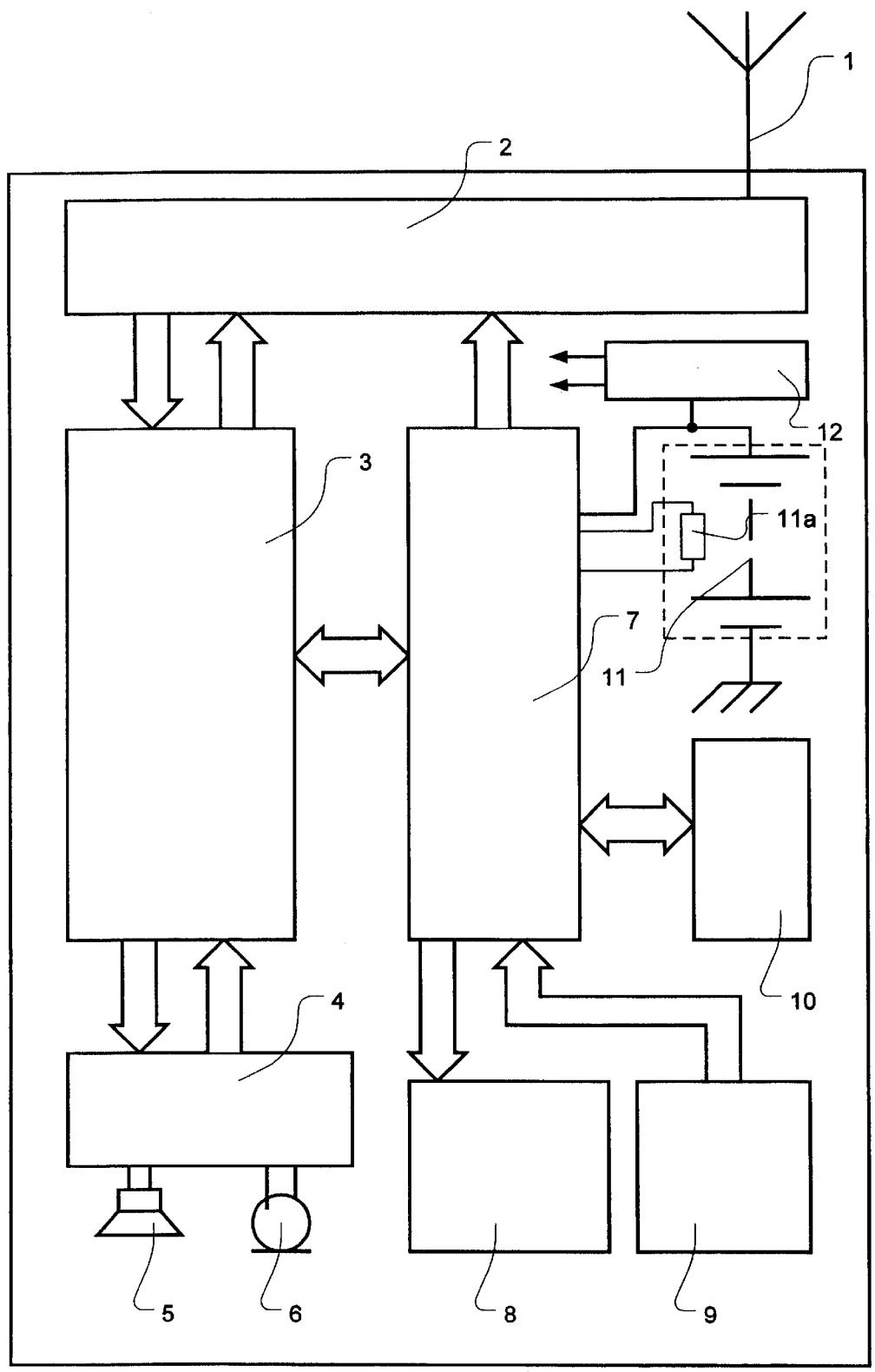
FIG. 1 is a block diagram of a mobile telephone according to the present invention.

Referring to FIG. 1, a mobile telephone comprises an antenna 1, an rf subsystem 2, a baseband DSP (digital signal processing) subsystem 3, an analogue audio subsystem 4, a loudspeaker 5, a microphone 6, a controller 7, a liquid crystal display 8, a keypad 9, memory 10, a battery 11 and a power supply circuit 12.

The rf subsystem 2 contains if and rf circuits of the mobile telephone's transmitter and receiver and a frequency synthesizer for tuning the mobile telephone's transmitter and receiver. The antenna 1 is coupled to the rf subsystem 2 for the reception and transmission of radio waves.

The baseband DSP subsystem 3 is coupled to the rf subsystem 2 to receive baseband signals therefrom and for sending baseband modulation signals thereto. The baseband DSP subsystems 3 includes codec functions which are well-known in the art.

The analogue audio subsystem 4 is coupled to the baseband DSP subsystem 3 and receives demodulated audio therefrom. The analogue audio subsystem 4 amplifies the demodulated audio and applies it to the loudspeaker 5. Acoustic signals, detected by the microphone 6, are pre-amplified by the analogue audio subsystem 4 and sent to the baseband DSP subsystem 4 for coding.

The controller 7 controls the operation of the mobile telephone. It is coupled to the rf subsystem 2 for supplying tuning instructions to the frequency synthesizer and to the baseband DSP subsystem for supplying control data and management data for transmission. The controller 7 operates according to a program stored in the memory 10. The memory 10 is shown separately from the controller 7. However, it may be integrated with the controller 7. A timer for triggering interrupts is also provided by the controller 7.

The display device 8 is connected to the controller 7 for receiving control data and the keypad 9 is connected to the controller 7 for supplying user input data signals thereto. Amongst other function, the display device displays the estimated extant life of the battery 11 by The battery 11 is connected to the power supply circuit 12 which provides regulated power at the various voltages used by the components of the mobile telephone. The positive terminal of the battery 11 is connected to an analogue-to-digital converter (ADC) input of the controller 7.

The operation of the mobile telephone, insofar as it relates to the present invention, will now be described.

Figure 2:
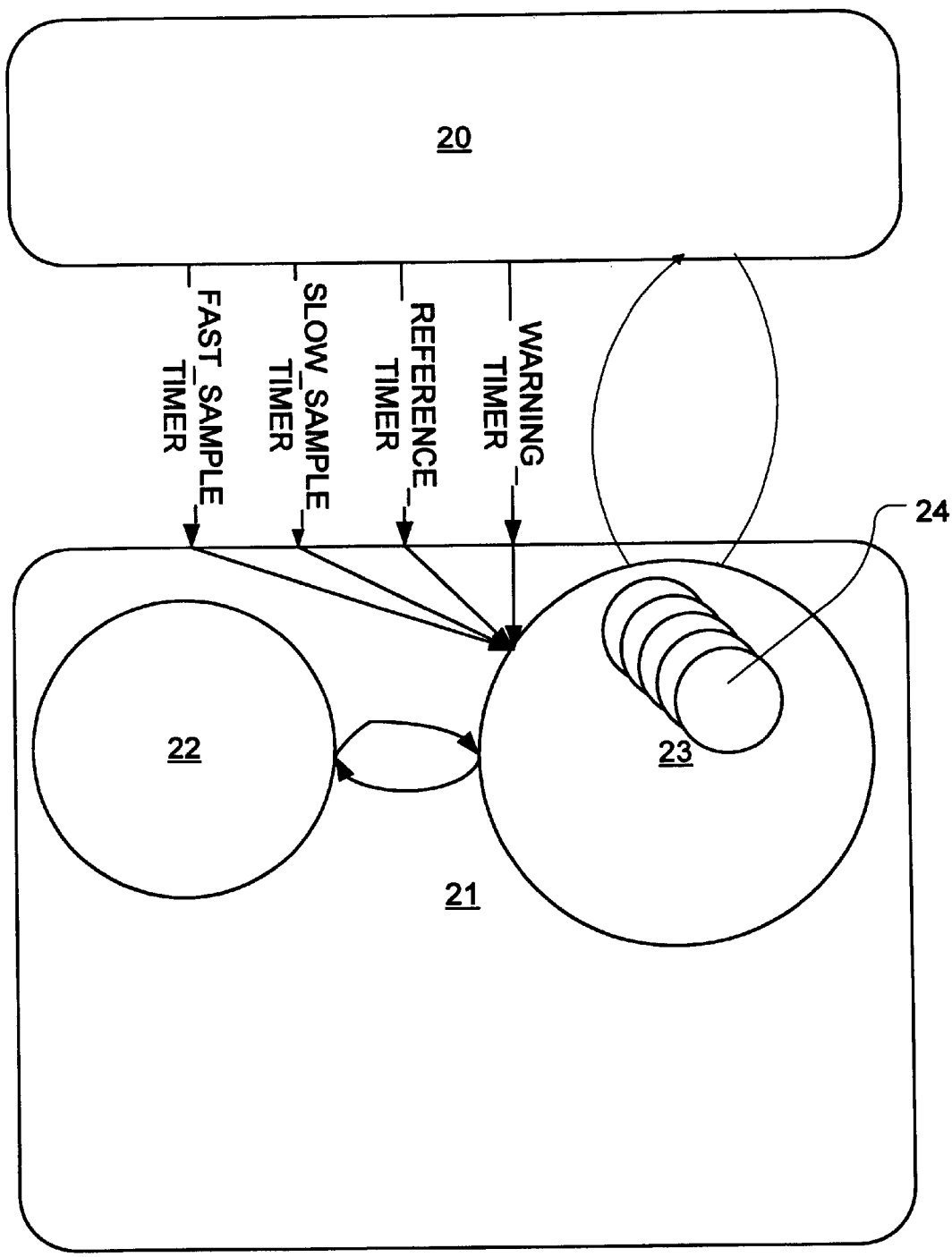
FIG. 2 is a block diagram of the software components of a battery management module.

Referring to FIG. 2, the controller 7 is programmed, inter alia, with an energy management server 20 and a battery management module 21. The monitor module 21 is itself can make calls to a control and interface sub-module 22 and a monitoring sub-module 22.

The details of the energy management server 20 are not directly relevant to the present invention. It is merely necessary to understand that the energy management server 20 provides an interface between the phone's operating system and the management module 21. One of the functions of the energy management server is to pass selected operating-system-generated messages to the management module 21.

The management module 21 implements event handlers of four event messages:
FAST_SAMPLE_TIMER
SLOW_SAMPLE_TIMER
REFERENCE_TIMER
WARNING_TIMER The FAST_SAMPLE_TIMER message is generated in response to the timeout of a first operating system timer and has an interval of 1 s.

The SLOW_SAMPLE_TIMER message is generated in response to the timeout of a second operating system timer and has an interval of 5 s.

The REFERENCE_TIMER message is generated in response to the timeout of a third operating system timer and has an interval of 60 s.

The WARNING_SAMPLE_TIMER message is generated in response to the timeout of a fourth operating system timer and has an interval of 120 s during active ode ("talk") and 3600 s in inactive mode ("standby").

The starting, stopping and configuration of the first, second, third and fourth timers is effected by the management module 21 as will become apparent from the following description.

The control and interface sub-module 22 has a plurality of interface functions 24 which allow the energy management server 20 to obtain battery-related information on behalf of other processes which may need this information. The functions can provide the current battery state (ok, low, empty), the maximum number of display bars for which the management module 21 has been configured, the number of bar remaining (i.e. the number of bar which should be being displayed to the user), the remaining battery capacity, the estimated standby operation time until the battery 11 enters the low state, the transmitter on battery voltage and the transmitter off battery voltage. Additionally, the control and interface sub-module 22 can send state change messages to the energy management server 20. More particularly, these messages include notification of changes in the number of bars remaining value, the battery state and entry of the battery 11 into the empty state. Additionally, if the mobile phone is in normal operation, notification of the entry of the battery 11 into the empty state is followed by a power off message. This enables other processes to shut down cleanly before that phone is actually powered down in response to the power off message.

Figure 3:
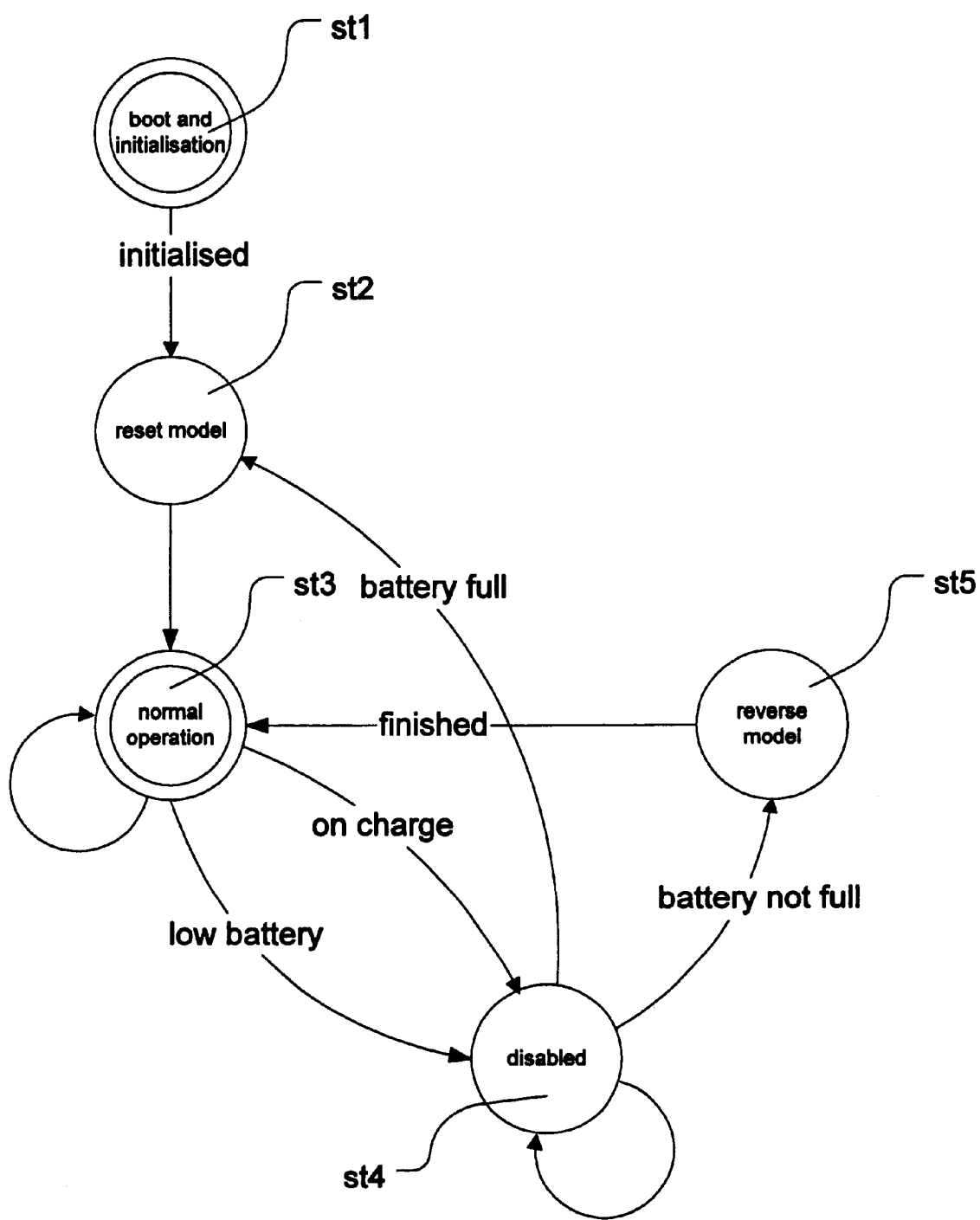
FIG. 3 is a state diagram of a monitoring sub-module of the module shown in FIG. 2.

Referring to FIG. 3, the management module 21 can operate in any of 5 states st1, . . . , st5. The first state is a boot state st1 which is entered when the mobile phone's control software is rebooted. When the initialisation, carried out in the boot state st1, has been completed, the management module 21 enters a reset model state st2. In the reset model state st2, the management module 21 performs additional initialisations which are required on occasions in addition to re-booting. When these further initialisations have been completed, the management module 21 enters a normal operation state st3. In the normal operation state st3, the management module 21 repeatedly samples the voltage of the battery 11 (FIG. 1) and calculates estimates of the extant battery life. If the voltage of the battery 11 enters the low state or the phone is put on charge, the monitoring sub-module 23 enters a "disabled" state st4 in which it ceases to estimate extant battery life. The monitoring sub-module 23 remains in the "disabled" state st4 until the phone is reset. This resetting occurs when the phone is no longer "on charge" and the battery 11 is not in the low state. If the battery 11 if "full", i.e. that battery voltage is over a "full" battery reference voltage which may be below the actual voltage of a fully charged battery, the battery management module 21 goes to the reset model state st2. However, if the battery 11 is not "full", the management module 21 enters a battery equivalent use determining state st5. In the batter equivalent use determining state, the battery monitoring sub-module 23 calculates the time for the phone in standby mode to have discharged a fully charged battery to its current level. Once this time has been calculated, the management module 21 returns to the normal operation state.

Figure 4:
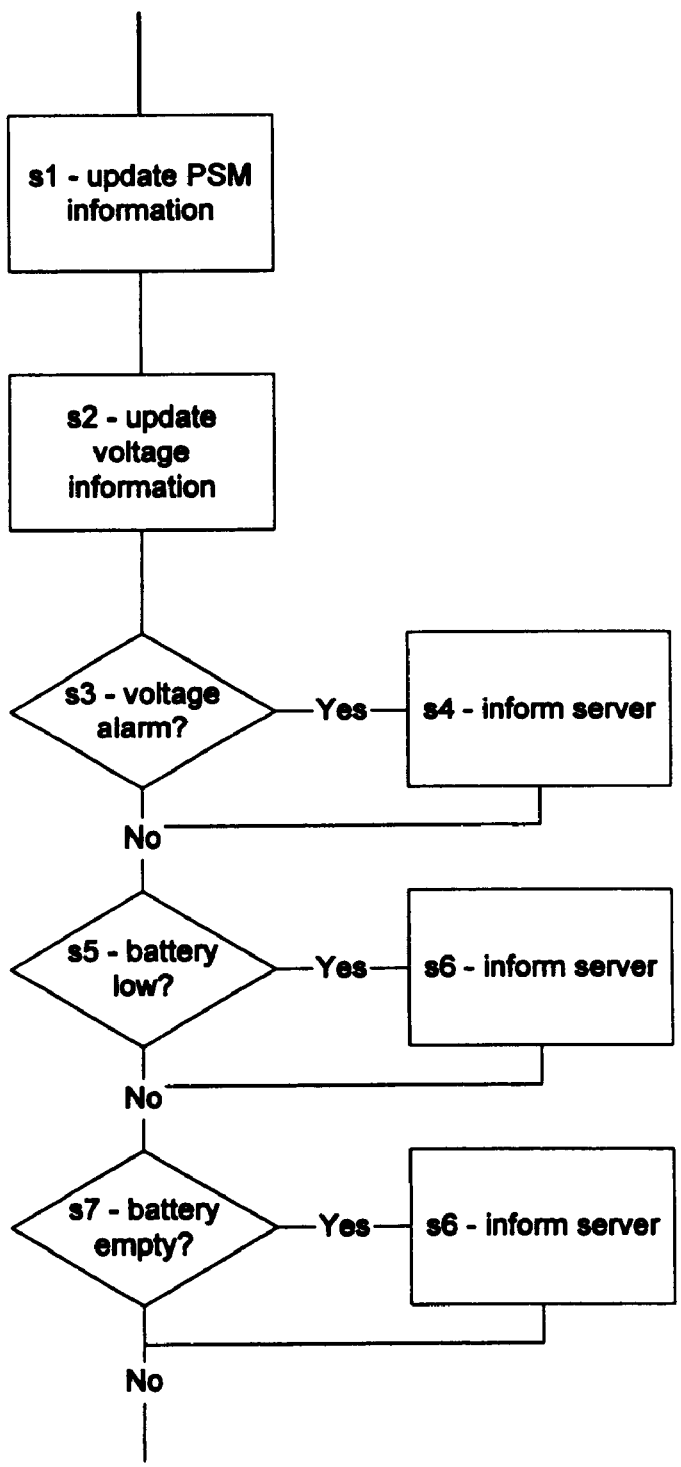
FIG. 4 is a flowchart illustrating a first function of the components shown in FIG. 2.

Referring to FIG. 4, whenever the management module 21 is activated in response to a FAST_SAMPLE_TIMER message or a SLOW_SAMPLE_TIMER message, the control and interface sub-module 22 updates the PSM information (step s1), reads the output of the ADC of the controller 7 (step s2) and updates the current voltage value $V_b$ for the battery 11. This value is not simply the latest reading from the ADC but a double median filtered value calculated from several sequentially taken readings.

The current voltage value is then tested to determine (step s3) whether a voltage alarm message should be sent (step s4) to the energy management server 20. Whether or not a voltage alarm message is sent, the current voltage is then compared with the "battery low" reference voltage (step s5) and if it is not above this reference voltage, a battery low message is sent to the energy management server 20 (step s6). Finally, whether or not a battery low message has been sent, it is determined whether the battery 11 is empty (step s7) and, if so, a battery empty message is sent to the energy management server 20, followed by a power off message (step s8).

Figure 5:
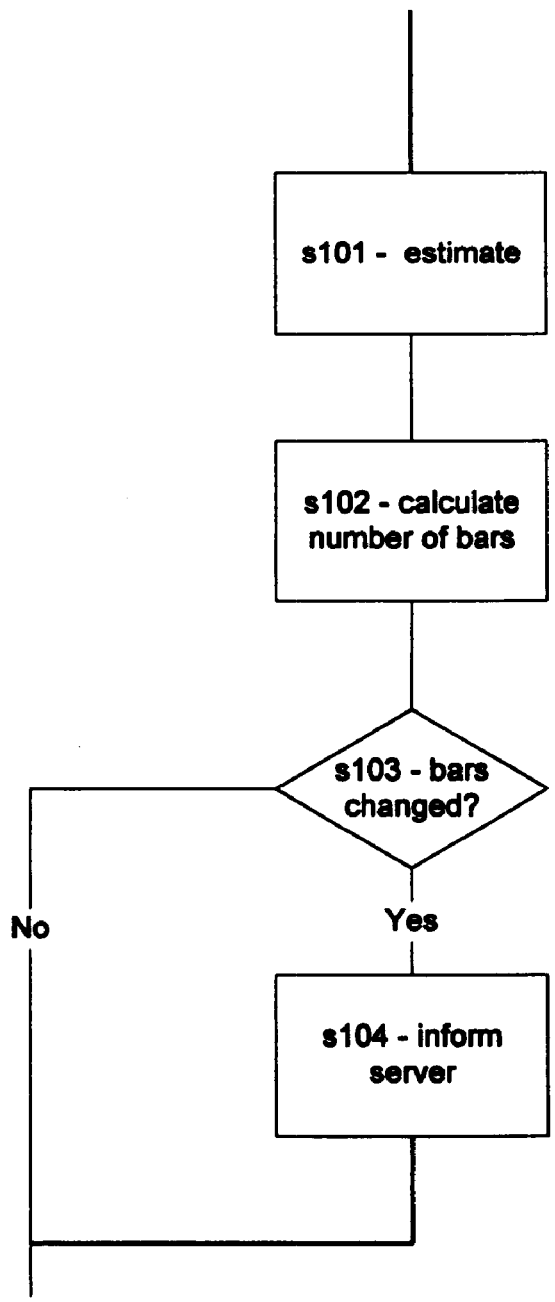
FIG. 5 is a flowchart for updating a user interface element displaying extant battery life.

Referring to FIG. 5, whenever the battery management module 21 is activated in response to a REFERENCE_TIMER, an extant battery life estimating process of the battery monitoring sub-module 23 is called with the phone mode and the current voltage being passed as parameters (step s101). This process returns an estimated standby operation time to low battery value (hereinafter "time remaining") which is passed to the interface and control sub-process 22 which determines whether the number of battery life display bars required to display battery life has changed (step s102) and, if so, sends a message to the energy management server 20 with the number of bars to be displayed (step s103).

Figure 6:
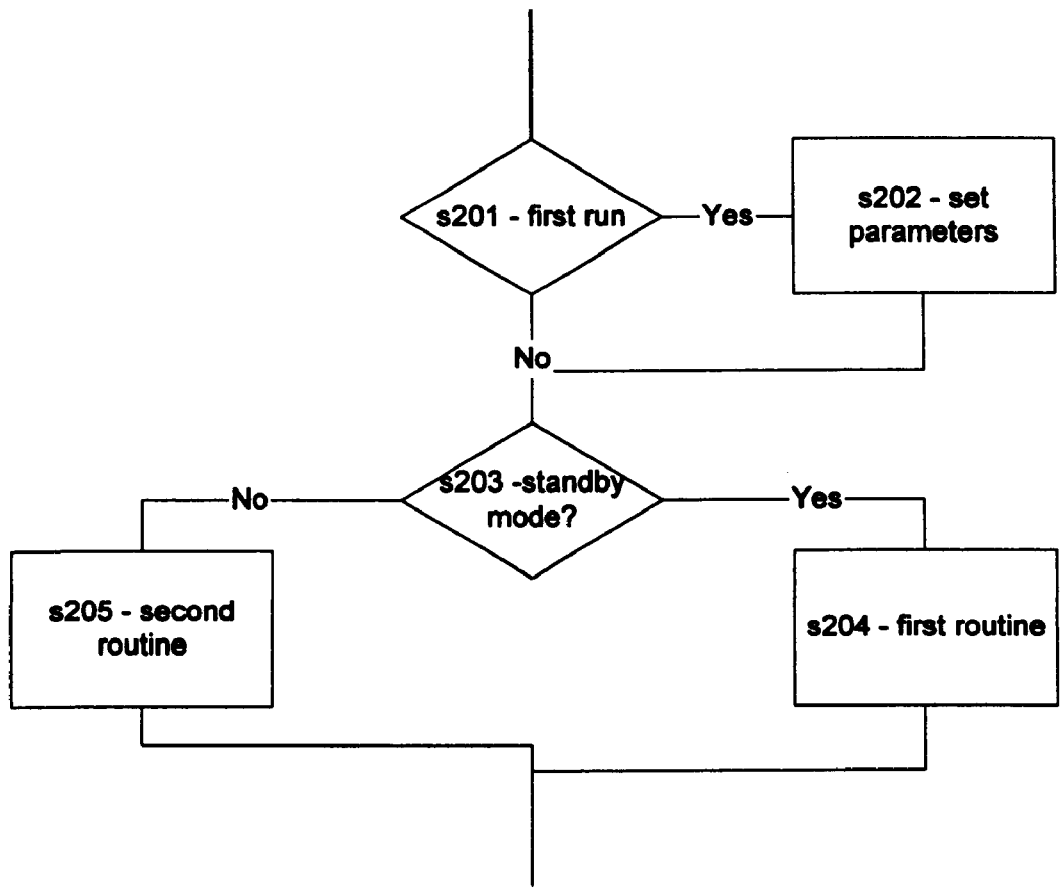
FIG. 6 is a flowchart showing part of the process of FIG. 5 in more detail.

Referring to FIG. 6, in the estimating process, it is first determined whether this is the first run of the estimating process since the phone was powered up (step s201). If so various parameters φ, ξ and α, which relate to the battery discharge voltage curve, are set to values appropriate to the type of battery being used (identified by a resistor 11a in the battery's housing) and the phones idle mode current demand which will depend on the system in which the phone is operating (e.g. GSM, AMPS, etc.) (step s202). The setting of these values is described in detail below. The phone mode parameter passed is then tested to determine which the mode the phone is in (steps s203). If the phone is in standby mode, a first routine (step s204) is performed, otherwise a second routine (step s205) is performed. Both routines (steps s204 and s205) produce an estimate of the time remaining which is returned.

The first routine (step s204) estimates the time remaining using:

$$t_r = \left( \frac{\ln \frac{\varphi - V_{low}}{\zeta}}{\ln \alpha} - t_{elap} \right) \qquad \text{Eq. 1}$$

where $V_{low}$ is the battery low reference voltage and $t_{elap}$ is the equivalent standby mode operation elapsed time. $t_{elap}$ is updated by multiplying the actual elapsed time by a system factor related to the system currently being used by the phone (GSM, AMPS etc.). This is particularly relevant for multimode phones.

Figure 7:
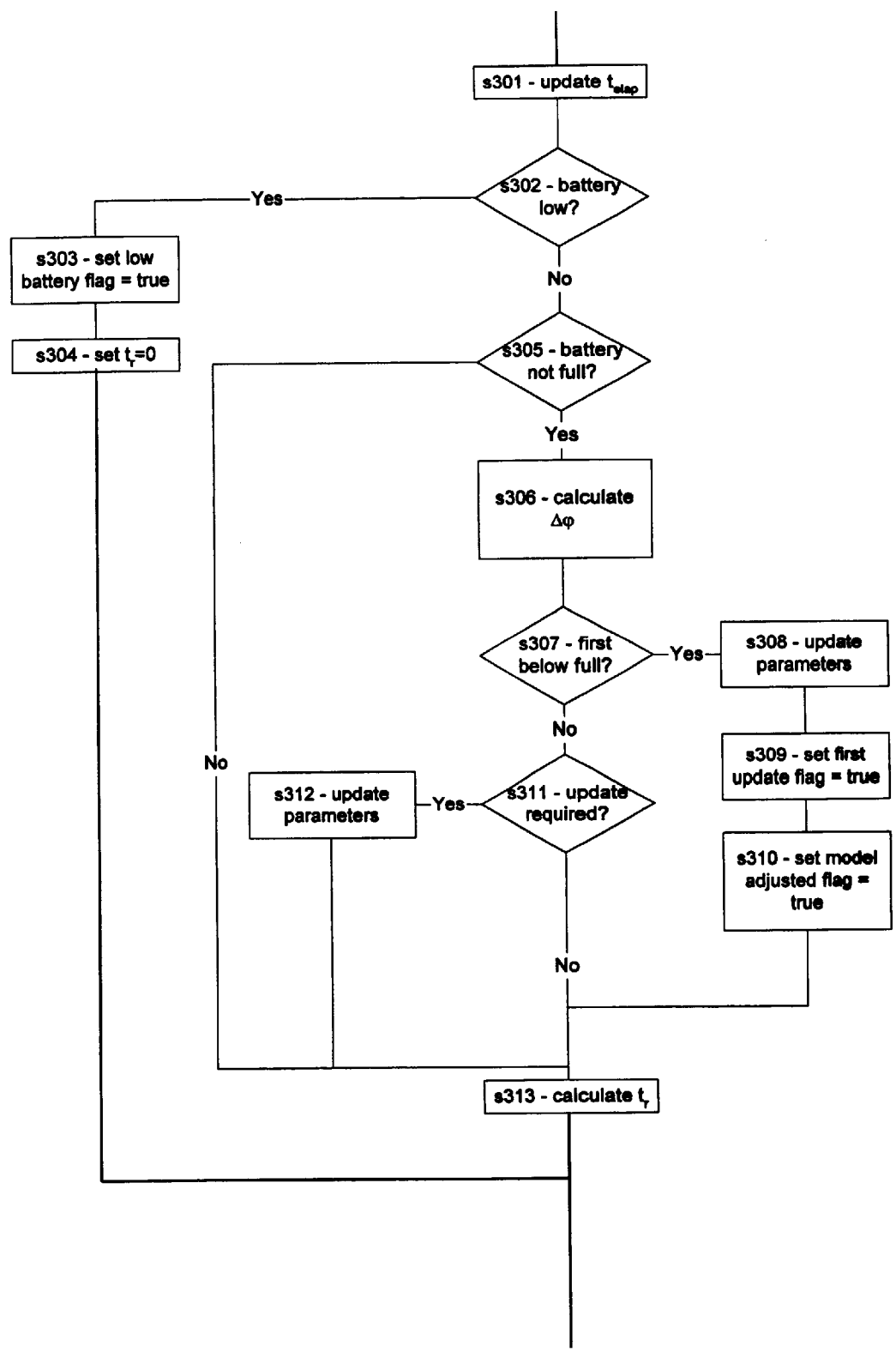
FIG. 7 is a flowchart showing part of the process of FIG. 6 in more detail.

Referring to FIG. 7, the first routine (step s204) first calculates the elapsed time, $t_{elap}$ (step s301). It is then determined whether the battery is low (step s302). If the battery is low, a battery low flag is set (step s303) and the time remaining value, $t_r$, is set to 0 (step s304). If the battery is not low, it is determined whether it is not full (step s305).

If the battery is determined to be full, a value for Δφ is calclauted (step s306) using:

$$\Delta \varphi = \varphi_b - \varphi \qquad \text{Eq. 2}$$

$$= V_b + \zeta \alpha^{t_{elap}} - \varphi$$

where $V_b$ is the current battery voltage, referred to above as calculated by the control and interface sub-module 22 and passed as a parameter.

Once $\Delta \varphi$ has been calculated, it is determined whether the battery voltage $V_b$ has just fallen below the "full" battery reference (step s307), i.e. a first update flag is false. If so, the parameters are updated (step s308) as follows:

$$\varphi_{new} = \varphi_{old} + 0.1 \Delta \varphi \qquad \text{Eq. 4}$$

$$\alpha_{new} = \alpha_{old} - \Delta \varphi \left[ \frac{\alpha_0 - 1}{\varphi_0} \right] \cdot 2$$

$$\zeta_{new} = \zeta_{old} + \Delta \varphi \left[ \frac{\zeta_0}{\varphi_0} \right] \cdot 2$$

Then, the first update flag and a model adjusted flag are set (steps s309 and s310).

If the battery voltage $V_b$ is continuing to be below the "full" battery voltage (step s307), it is determined whether a parameter update is required by comparing the magnitude of $\Delta \varphi$ with a reference value therefore (step s311). If the magnitude of $\Delta \varphi$ is above the reference, the parameters are updated (step s312) as follows:

$$\varphi_{new} = \varphi_{old} + \left[ \Delta \varphi - \frac{|\Delta \varphi|}{\Delta \varphi} \cdot \Delta \varphi_{acceptable} \right] \cdot \mu_\varphi \qquad \text{Eq. 5}$$

$$\alpha_{new} = \alpha_{old} - \Delta \varphi \cdot \mu_\alpha$$

$$\zeta_{new} = \zeta_{old} - \Delta \varphi \cdot \mu_\zeta.$$

where $\Delta \varphi_{acceptable}$ is set at design time at 0.05V and $\mu_\varphi$ is set at design time at 1.5.

Once any necessary parameter updates have been performed, the value of $t_r$ is calculated using Equation 1 above (step s311). Step s313 is performed immediately after step s305 if the battery is "full". The value of $t_r$ is then returned.

Figure 8:
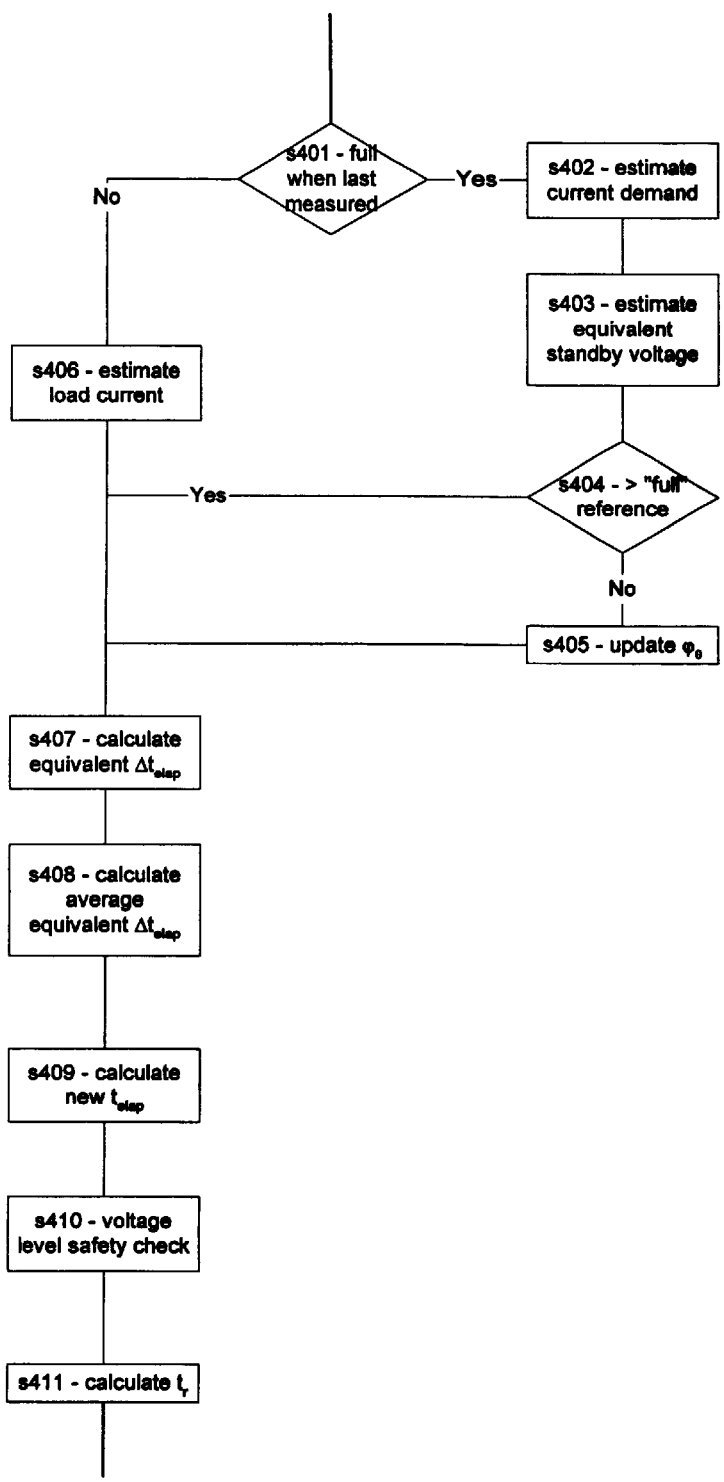
FIG. 8 is a flowchart showing part of the process of FIG. 6 in more detail.

Referring to FIG. 8, in the second routine (step 205), it is first determined whether the battery 11 should be regarded as "full" (step s401). This is done by looking at the state opf the model adjusted flag which will only be true is the battery voltage has fallen below "full" in standby mode. If the battery 11 is to be considered to be "full", the prevailing current demand placed on the battery 11 is estimated (step s402), based on the phone's operating mode and a table of typical current demands for different operating modes. This current value is then used to estimate what the battery voltage would have been if the phone had been in standby mode (step s403). This voltage is then compared with the "full" battery reference (step s404). If the estimated voltage ($V_{stby\_est}$) is not greater than the "full" battery reference (step s404), the parameter $\varphi$ is modified (step s405) as follows:

$$\varphi_b = V_{stby\_est} + \zeta \alpha^{t_{elap}}$$

$$\Delta \varphi = \varphi_b - \varphi_{old}$$

$$\varphi_{new} = \varphi_{old} + \Delta \varphi_b \cdot 0.5 \qquad \text{Eq. 7}$$

If the battery 11 is not considered to be "full" at step s401, the prevailing load current is estimated (step s406). This estimate is made using:

$$I_{load} = \frac{[\varphi + \zeta \alpha^{t_{elap}}] - V_b}{R_b} \qquad \text{Eq. 8}$$

where $R_b$ is an approximate value for the resistance of the battery 11 between its "full" and low conditions and $V_b$ is the measured battery voltage.

Following steps s405 and s406, and following step s405 if the battery 11 is "full", a standby mode equivalent elapsed time is calculated (step s407) using:

$$\Delta t_{elap} = \left( 1 + \frac{I_{load}}{I_{min\_stby}} \right) \cdot \Delta t_{elap\_measured} \qquad \text{Eq. 9}$$

where $I_{stby\_min}$ is the minimum standby current drawn by the phone and $\Delta t_{elap\_measured}$ is the actual time that has elapsed.

The average of $\Delta t_{elap}$ is then calculated for the present and preceding five values (step s408) and then $t_{elap}$ is updated with this average (step s409)

Figure 9:
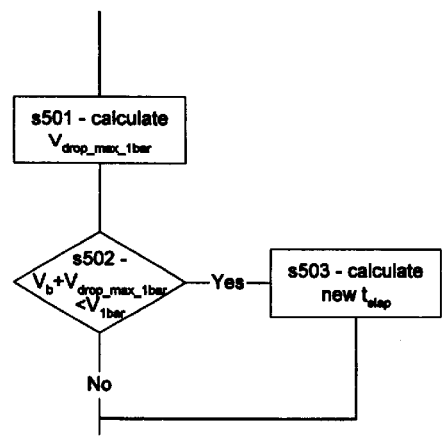
FIG. 9 is a flowchart showing part of the process of FIG. 8 in more detail.

Once $t_{elap}$ has been updated, a voltage level check is performed (step s410). Referring to FIG. 9, in step s410, a value $V_{drop\_max\_1bar}$ is calculated as the product of 2, the prevailing load current and the battery resistance (step s501). This value is then added to the current battery voltage and the result compared with the voltage corresponding to one bar on the display 7 (step s502). If the calculated value is less than the 1 bar voltage, a new value for $t_{elap}$, corresponding to the 1 bar voltage is calculated (step s503) using:

$$t_{elap} = \frac{\ln \frac{\varphi - V_b}{\zeta}}{\ln \alpha} \qquad \text{Eq. 10}$$

Returning to FIG. 8, a new remain time is then calculated using Equation 1 (step s411).

The remaining time value, however derived, is passed to the interface and control sub-module 22. The interface and control sub-module 22 then calculates the number of bar that need to be displayed using:

$$\text{bar\_level} = \frac{t_r - \text{warning\_margin}}{\text{time\_per\_bar}} \qquad \text{Eq. 11}$$

If the number of bars is greater than those provided for in the display 7, the number bars is set to this maximum.

Figure 10:
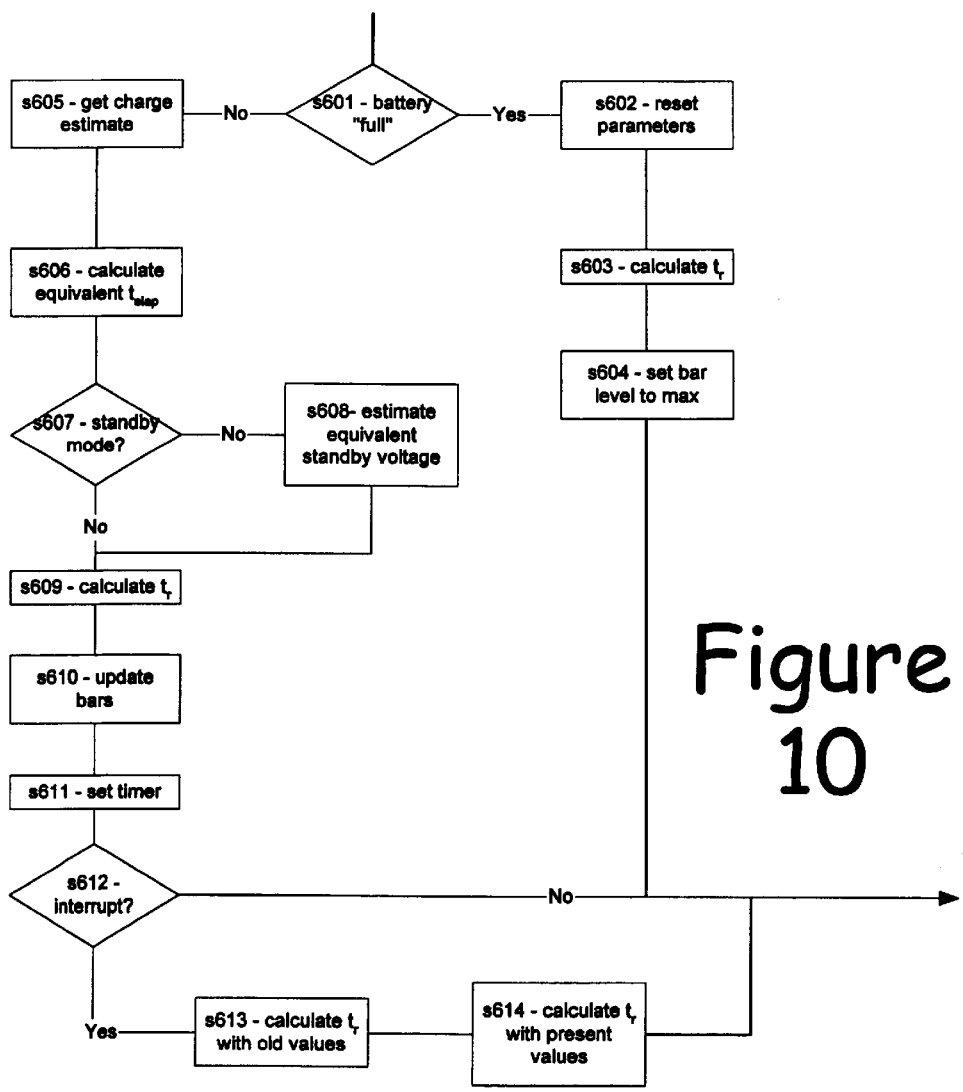
FIG. 10 is a flowchart of the operation of the components shown in FIG. 2 when the mobile phone come off charge.

Referring to FIG. 10, when the phone comes off charge, the battery management module 21 first determines whether the battery 11 is "full" (step s601). If the battery 11 is fully charged, the parameters $\varphi$, $\alpha$ and $\zeta$, used by the first and second routines of the battery monitoring sub-module 23, are reset to their default values (step s602). Then a call is made to the battery monitoring sub-module 23 for calculation of the time remaining (step s603) and, consequently, the bar level is set to the maximum number by the interface and control module (step s604).

If the battery 11 is not full (step s601), an estimate of the charge in the battery 11 is obtained from the charging sub-system (step s605). This value is then used to calculate the equivalent $t_{elap}$ that would have reduced a full battery to the battery's current state (step s606). It is then determined whether the phone is in standby mode (step s607). If the phone is not in standby mode, the equivalent standby voltage is calculated from $t_{elap}$ (step s608).

If the phone is in standby mode, the battery monitoring sub-module 23 is called to get a new value for the remaining time (step s609) and the battery bars value updated (step s610).

A 10 minute timer is then set (step s611) to prevent the battery monitoring sub-module 23 being called for that period, unless it has been interrupted by the phone leaving standby mode (step s612). If the wait is interrupted, the battery monitoring sub-module 23 is called with standby parameter and the latest standby voltage as parameters (step s613) and then with the actual prevailing mode and voltage (step s614).

The process of establishing the default parameter values will now be described.

Figure 11:
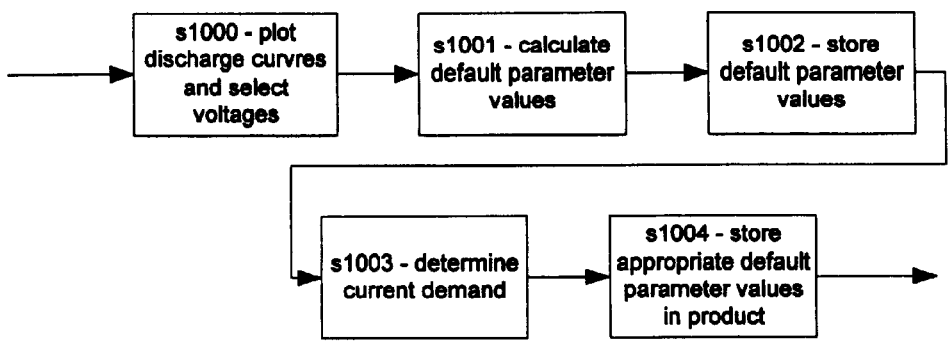
FIG. 11 is al flowchart illustrating a manufacturing process.

Referring to FIG. 11, for each type of battery chemistry a set of constant current discharge curves, e.g. 2 mA, 5 mA, 10 mA, 20 mA, for a selected capacity, e.g. 900 mAh, is determined by experiment and the voltages ($V_t$, $V_{t+\Delta t}$, $V_{t+2\Delta t}$) at three points on each curve are selected (step s1000). Each curve may be produced by averaging voltages measured in an plurality of repeated tests. These points should be on parts of the curves which are well modelled by Equation 10. However, the best positions will need to be determined empirically in the light of the characteristics of the battery 11 and its intended use.

For each battery chemistry/current combination parameters are calculated from these voltages as follows (step s1001):

$$\alpha_{default} = e^{\frac{\ln((V_{t+\Delta t}-V_{t+2\Delta t})/(V_t-V_{t+\Delta t}))}{\Delta t}} \qquad \text{Eq. 12}$$

$$\zeta_{default} = \frac{(V_{t+2\Delta t} - V_{t+\Delta t})}{(\alpha_{default}^{t+2\Delta} - \alpha_{default}^{t+\Delta})}$$

$$\varphi_{default} = V_t + \zeta_{default}\alpha_{default}^{t}$$

The sets of default values for each battery chemistry/current combination are then stored (step s1002).

When a new phone or other product is being developed, its current demand in its lowest power operational mode is determined (step s1003). The stored parameters for one or more of the battery chemistries for the test current nearest to the current demand, determined at step s1003, are then programmed into the phone or other product (step s1004).

In the present embodiment, the default parameter values for Li-ion and NiMH 900 mAh batteries at 2 mA are stored in the phone.

Only a single set of parameter values for each battery chemistry are required because it has been found that the $\Delta_{default}$ value can be scaled as a function of battery capacity for both Li-ion and NiMH batteries using the formulae:

$$\alpha_0 = \left[(\alpha_{default} - 1) \cdot \frac{C_{default}}{C_{new}}\right] + 1 \text{ for Li-ion} \qquad \text{Eq. 13}$$

$$\alpha_0 = \left[(\alpha_{default} - 1) \cdot \frac{C_{default}}{C_{new}(1+Y)}\right] + 1 \text{ for NiMH}$$

where $C_{default}$ is the default battery capacity, 900 mAh in this case, $C_{new}$ is the capacity of the battery 11 being used, e.g. 600 mAh or 1600 mAh and Y is a factor relating to the self-discharging characteristic of NiMH batteries. It should be borne in mind that the values of the resistors in the batteries are related to capacity such that new battery capacities can be handled without alteration of the phones software. By way of a simple illustrative example, the resistor may be related to capacity by the formula:

$$R = 2 \times 10^6 + C$$

where C is the capacity in mAh.

The values for $\phi_{default}$ and $\xi_{default}$ do not need to change, at least over the battery capacity range 600 mAh to 1600 mAh with the default chosen as 900 mAh.

Also, the value of $\alpha_0$, produced by scaling $\alpha_{default}$ for battery capacity if necessary, and equal to $\alpha_{default}$ if scaling for battery capacity is not necessary, can be scaled according to the basal load current. In the present embodiment, the following scaling formula is used:

$$\alpha_{0_{new}} = \left[(\alpha_0 - 1) \cdot \frac{I_{exp}}{I_{default}}\right] + 1 \qquad \text{Eq. 14}$$

where $I_{exp}$ is the expected average standby current based on the current phone operating mode and $I_{default}$ is the average standby current of the phone in its operating mode which has the lowest current demand, for Li-ion batteries.

For NiMH batteries two similar formulae are used, one when $I_{exp} < I_{default}$:

$$\alpha_{0_{new}} = \left[(\alpha_0 - 1) \cdot \frac{I_{exp}}{I_{default} \cdot 0.95}\right] + 1 \qquad \text{Eq. 15}$$

and:

$$\alpha_{0_{new}} = \left[(\alpha_0 - 1) \cdot \frac{I_{exp}}{I_{default} \cdot 1.05}\right] + 1 \qquad \text{Eq. 16}$$

if $I_{exp} > I_{default}$.

This difference is due to the significant self-discharge current that occurs in NiMH batteries.

Figure 12:
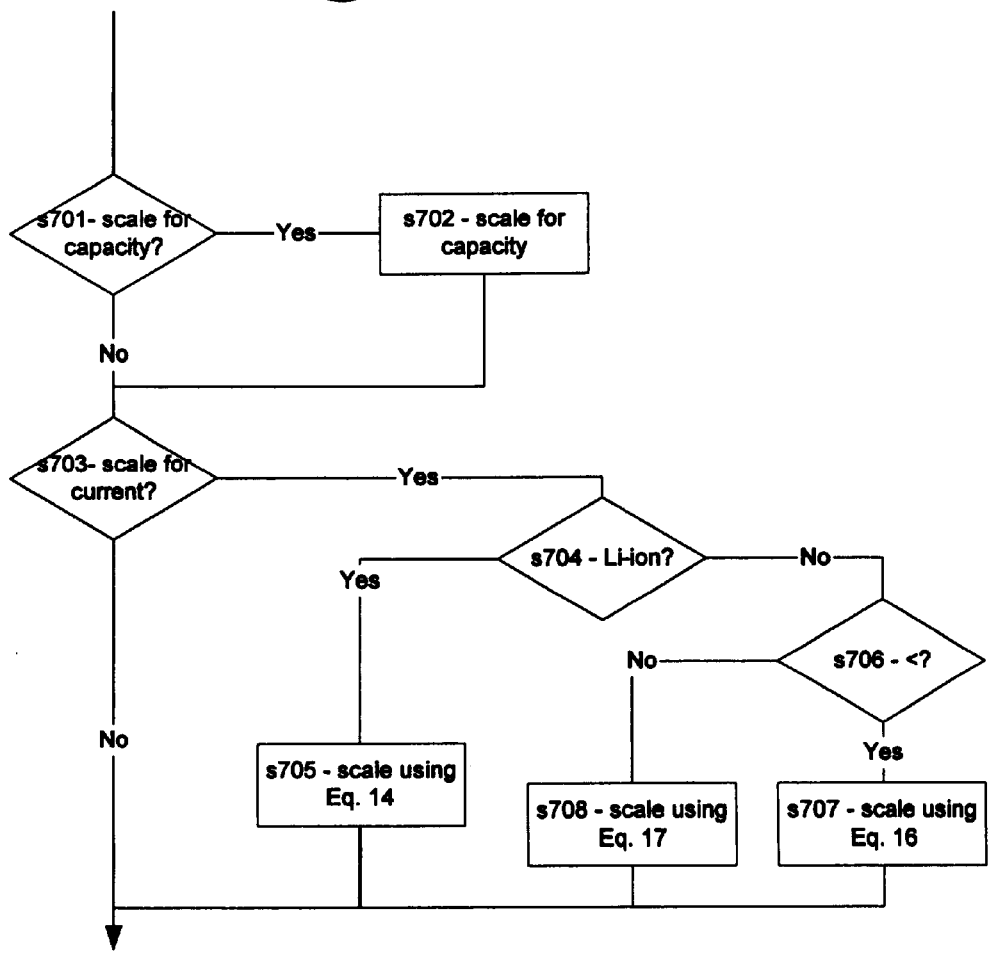
FIG. 12 is a flowchart illustrating part of the process of FIG. 6 in more detail.

Step s202 (FIG. 6) will now be explained in detail. Referring to FIG. 12, in the modified step, the default model parameters for the type of the battery 11 (Li-ion or NiMH) are first loaded (step s701). It is then determined whether scaling for a non-default battery capacity is required, i.e. a greater than 10% deviation from the default, (step s702) and, if so, $\alpha_{default}$ is scaled to produce $\alpha_0$ according to Equation 13 (step s702) otherwise $\alpha_{default}$ becomes $\alpha_0$. Then it is determined whether current scaling is required on the basis of the phone's operating mode (step s703). If current scaling is required, it is determined whether the battery 11 is Li-ion or NiMH (step s704). If is Li-ion, $\alpha_0$ is scaled according to Equation 14 (step s705) and, if it is NiMH, $\alpha_0$ is scaled according to Equation 15 (step s707) or Equation 16 (step s708) depending on whether $I_{exp} < I_{default}$ or $I_{exp} > I_{default}$.

It is to be understood that many modifications may be made to the above-described embodiment. For instance, the apparatus need not be a mobile phone and could be a PDA or a personal stereo.

What is claimed is:

1. A battery powered apparatus comprising a battery, a memory storing a set of default parameter values appropriate for calculating a total life estimate of a reference battery according to an algorithm and processing means programmed to estimate the extant life of said battery of the apparatus by scaling at least one of said parameter values in dependence on the capacity of said battery of the apparatus and calculating a total life estimate for said battery of the apparatus using the or each scaled parameter value and said algorithm.

2. An apparatus according to claim 1, wherein said battery of the apparatus includes means identifying its capacity and the processing means comprises means for determining the capacity of said battery from said capacity identifying means.

3. An apparatus according to claim 2, wherein the processing means is programmed to implement said algorithm by calculating said total life estimate for the battery of the apparatus using the formula:

$$\frac{\ln\left(\frac{\varphi - V_{low}}{\zeta}\right)}{\ln \alpha}$$

where $\varphi$, $\zeta$ and $\alpha$ constitute parameters for which said default values are stored in the memory and $V_{low}$ is a battery voltage indicative of the battery of the apparatus approaching an empty state.

4. An apparatus according to claim 3, wherein the battery is a Li-ion battery and the processing means is programmed to scale the parameter $\alpha$ according the capacity of the battery by implementing the formula:

$$\alpha = \left[(\alpha_{default} - 1) \cdot \frac{C_{default}}{C_{new}}\right] + 1$$

where $C_{default}$ is the capacity of the reference battery and $C_{new}$ and the value of $\alpha_{default}$ being one of said default parameter values stored in the memory.

5. An apparatus according to claim 3, wherein the battery is a NiMH battery and the processing means is programmed to scale the parameter $\alpha$ according the capacity of the battery by implementing the formula:

$$\alpha = \left[(\alpha_{default} - 1) \cdot \frac{C_{default}}{C_{new}(1 + Y)}\right] + 1$$

where $C_{default}$ is the capacity of the reference battery and $C_{new}$ and the value of $\alpha_{default}$ being one of said default parameter values stored in the memory.

6. A method of manufacturing a battery powered apparatus having processing means, the method comprising:
discharging a battery at a constant current and recording the voltage across the battery as it discharges;
determining default parameter values for a battery discharge model for estimating total battery life from the recorded voltages; and
programming said processing means with a program implementing said model and the values of said parameter values,
wherein the programming means is programmed to scale the product of the application of said model in dependence on a current demand value dependant on said apparatus.

7. A method according to claim 6, wherein the parameters are for a model of the form:

$$\frac{\ln\left(\frac{\varphi - V_{low}}{\zeta}\right)}{\ln \alpha}$$

where $\varphi$, $\zeta$ and $\alpha$ constitute parameters for which said default values are stored in the memory and $V_{low}$ is a battery voltage indicative of the battery of the apparatus approaching an empty state.

8. A method according to claim 7, wherein said scaling comprises scaling the default value of the parameter $\alpha$, stored in the memory.

9. A method according to claim 8, wherein the or each battery is a Li-ion battery and the or each processing means is programmed to scale the default value of $\alpha$ according to the formula:

$$\alpha = \left[(\alpha_{default} - 1) \cdot \frac{I_{exp}}{I_{default}}\right] + 1$$

where $I_{exp}$ is said apparatus dependent current value and $I_{default}$ is the respective discharge current for which the parameter values, programmed into the or each apparatus, were determined.

10. A method according to claim 8, wherein the or each battery is a NiMH battery and the or each processing means is programmed to scale the default value of $\alpha$ according to the formula:

$$\alpha = \left[(\alpha_{default} - 1) \cdot \frac{I_{exp}}{I_0 \cdot (1 - X)}\right] + 1$$

if the apparatus dependent current is greater than that relating to the programmed parameter value and according to the formula:

$$\alpha = \left[(\alpha_{default} - 1) \cdot \frac{I_{exp}}{I_{default} \cdot (1 + X)}\right] + 1$$

if the apparatus dependent current is less than that relating to the programmed parameter value,
where $I_{exp}$ is said apparatus dependent current value and $I_{default}$ is the respective discharge current for which the parameter values, programmed into the or each apparatus, were determined.

11. A method according to claim 10, wherein X is about 0.05.

12. A method according to claim 6, comprising:
discharging a battery, of the same type, at a further constant current and recording the voltage across the battery as it discharges;
determining further default parameter values for the battery discharge model for estimating total battery life from the recorded voltages for said further constant current discharge,
wherein the model parameter values programmed into the processing means are selected from said determined default parameter values in dependence on said apparatus dependent current value.

13. A method according to claim 12, wherein the parameters are for a model of the form:

$$\frac{\ln\left(\frac{\varphi - V_{low}}{\zeta}\right)}{\ln \alpha}$$

where $\varphi$, $\zeta$ and $\alpha$ constitute parameters for which said default values are stored in the memory and $V_{low}$ is a battery voltage indicative of the battery of the apparatus approaching an empty state.

14. A method according to claim 13, wherein said scaling comprises scaling the default value of the parameter $\alpha$, stored in the memory.

15. A method according to claim 14, wherein the or each battery is a Li-ion battery and the or each processing means is programmed to scale the default value of $\alpha$ according to the formula:

$$\alpha = \left[(\alpha_{default} - 1) \cdot \frac{I_{exp}}{I_{default}}\right] + 1$$

where $I_{exp}$ is said apparatus dependent current value and $I_{default}$ is the respective discharge current for which the parameter values, programmed into the or each apparatus, were determined.

16. A method according to claim 14, wherein the or each battery is a NiMH battery and the or each processing means is programmed to scale the default value of α according to the formula:

$$\alpha = \left[(\alpha_{default} - 1) \cdot \frac{I_{exp}}{I_0 \cdot (1 - X)}\right] + 1$$

if the apparatus dependent current is greater than that relating to the programmed parameter value and according to the formula:

$$\alpha = \left[(\alpha_{default} - 1) \cdot \frac{I_{exp}}{I_{default} \cdot (1 + X)}\right] + 1$$

if the apparatus dependent current is less than that relating to the programmed parameter value,
where $I_{exp}$ is said apparatus dependent current value and $I_{default}$ is the respective discharge current for which the parameter values, programmed into the or each apparatus, were determined.

17. A method according to claim 16, wherein X is about 0.05.

18. A method of manufacturing a plurality of different battery powered apparatuses having respective processing means and different current demands, the method comprising:
 discharging a battery or a plurality of batteries of the same type at a plurality of different constant currents and recording the voltage across the or each battery as it discharges;
 for each discharge current, determining default parameter values for a battery discharge model for estimating total battery life from the recorded voltages; and
 for each apparatus, programming its processing means with a program implementing said model and the default parameter values for the discharge current nearest to a respective apparatus dependent current demand value,
 wherein each programming means is programmed to scale the product of the application of said model in dependence on the relevant current demand value.

19. A method according to claim 18, wherein the parameters are for a model of the form:

$$\frac{\ln\left(\frac{\varphi - V_{low}}{\zeta}\right)}{\ln \alpha}$$

where φ, ζ and α constitute parameters for which said default values are stored in the memory and $V_{low}$ is a battery voltage indicative of the battery of the apparatus approaching an empty state.

20. A method according to claim 19, wherein said scaling comprises scaling the default value of the parameter α, stored in the memory.

21. A method according to claim 20, wherein the or each battery is a Li-ion battery and the or each processing means is programmed to scale the default value of α according to the formula:

$$\alpha = \left[(\alpha_{default} - 1) \cdot \frac{I_{exp}}{I_{default}}\right] + 1$$

where $I_{exp}$ is said apparatus dependent current value and $I_{default}$ is the respective discharge current for which the parameter values, programmed into the or each apparatus, were determined.

22. A method according to claim 20, wherein the or each battery is a NiMH battery and the or each processing means is programmed to scale the default value of α according to the formula:

$$\alpha = \left[(\alpha_{default} - 1) \cdot \frac{I_{exp}}{I_0 \cdot (1 - X)}\right] + 1$$

if the apparatus dependent current is greater than that relating to the programmed parameter value and according to the formula:

$$\alpha = \left[(\alpha_{default} - 1) \cdot \frac{I_{exp}}{I_{default} \cdot (1 + X)}\right] + 1$$

if the apparatus dependent current is less than that relating to the programmed parameter value,
where $I_{exp}$ is said apparatus dependent current value and $I_{default}$ is the respective discharge current for which the parameter values, programmed into the or each apparatus, were determined.

23. A method according to claim 22, wherein X is about 0.05.

24. A battery powered apparatus comprising a battery and processing means configured for calculating an extant battery life estimate for the battery using a battery discharge model, wherein the product of the use of said model is scaled by the processing means in dependence on a current demand value for the apparatus.

25. An apparatus according to claim 24, wherein the model is of the form:

$$\frac{\ln\left(\frac{\varphi - V_{low}}{\zeta}\right)}{\ln \alpha}$$

and the processing means is programmed with default values for φ, ζ, α and $V_{low}$ and the value for α used is derived from the programmed default value for α in dependence on said current demand value, and $V_{low}$ is a battery voltage indicative of the battery of the apparatus approaching an empty state.

26. An apparatus according to claim 25, wherein the battery is a Li-ion battery and the value of the parameter α used is determined according to the formula:

$$\alpha = \left[(\alpha_{default} - 1) \cdot \frac{I_{exp}}{I_{default}}\right] + 1$$

where $I_{exp}$ is said apparatus dependent current value and $I_{default}$ is the discharge current for which the parameter values, programmed into the apparatus, were determined.

27. An apparatus according to claim 25, wherein the battery is a NiMH battery and the value of the parameter α used is determined according to the formula:

$$\alpha = \left[ (\alpha_{default} - 1) \cdot \frac{I_{exp}}{I_{default} \cdot (1 - X)} \right] + 1$$

where $I_{exp}$ is said apparatus dependent current value and $I_{default}$ is the discharge current for which the parameter values, programmed into the apparatus, were determined.

28. An apparatus according to claim 27, wherein X is about 0.05.

29. An apparatus according to claim 25, wherein the battery is a NiMH battery and the value of the parameter α used is scaled according to the formula:

$$\alpha = \left[ (\alpha_{default} - 1) \cdot \frac{I_{exp}}{I_{default} \cdot (1 + X)} \right] + 1$$

where $I_{exp}$ is said apparatus dependent current value and $I_{default}$ is the discharge current for which the parameter values, programmed into the apparatus, were determined.

30. An apparatus according to claim 29, wherein X is about 0.05.

31. A battery-powered apparatus including a battery voltage sensor for sensing the voltage of a battery powering the apparatus and processing means, wherein the processing means is configured to estimate the extant life of a battery powering the apparatus by:

using a battery voltage value, derived from the voltage measured by said sensor, and a battery discharge elapsed time value to determine whether the value of a dominating parameter of a function, derived from a model of a substantial part of the discharging of a battery, meets a fitness criterion; and if the value of said dominating parameter fails to meet said fitness criterion, modifying said dominating parameter's value in a predetermined manner and then calculating an estimate of extant battery life using said function.

32. An apparatus according to claim 31, wherein the processing means is configured to generate said elapsed time value is by scaling a measured time value using a function of battery load current.

33. An apparatus according to claim 32, wherein the processing means is configured to select an expected load current value from a collection of load current values indexed by operating modes of the apparatus.

34. An apparatus according to claim 31, wherein the processing means is configured to modify the value of a further parameter of said function if said dominating parameter's value fails to meet said fitness criterion.

35. An apparatus according to claim 34, wherein the processing means is configured to generate said elapsed time value is by scaling a measured time value using a function of battery load current.

36. An apparatus according to claim 35, wherein the processing means is configured to select an expected load current value from a collection of load current values indexed by operating modes of the apparatus.

37. An apparatus according to claim 31, wherein said function is of the form:

$$t_r = \left( \frac{\ln \frac{\varphi - V_{low}}{\zeta}}{\ln \alpha} - t_{elap} \right)$$

where $t_r$ is the extant battery life value, ϕ is said dominating parameter, α and ζ are further parameters, $V_{low}$ is a battery voltage indicative of the battery approaching an empty state, and $t_{elap}$ is said elapsed time value, and said model relates battery voltage to discharge time at constant current thus:

$$V_b = \phi - \zeta \alpha^{t_{elap}}.$$

38. An apparatus according to claim 37, wherein said fitness criterion is:

$$\Delta \phi_{acceptable} > V_b + \zeta \alpha^{t_{elap}} - \phi$$

where $V_b$ is the current battery voltage value.

39. An apparatus according to claim 38, wherein $\Delta \phi_{acceptable}$ is in the range 0.04V to 0.06V, preferably 0.05V.

40. An apparatus according to claim 31, wherein said battery is connected to said apparatus and the battery is a Li-ion or NiMH battery.

41. A mobile phone including a battery, a voltage sensor for measuring the voltage of the battery and a processor configured to control the mobile phone for operation in a standby mode and in a non-standby mode, the processor being further configured to estimate the extant life of said battery in said standby mode by an extant battery life estimating process comprising:

using a battery voltage value, derived from the voltage measured by said sensor, and a battery discharge elapsed time value to determine whether the value of a dominating parameter of a function, derived from a model of a substantial part of the discharging of a battery, meets a fitness criterion; and if the value of said dominating parameter fails to meet said fitness criterion, modifying said dominating parameter's value in a predetermined manner and calculating an estimate of extant battery life using said function.

42. A mobile phone according to claim 41, wherein said function is of the form:

$$t_r = \left( \frac{\ln \frac{\varphi - V_{low}}{\zeta}}{\ln \alpha} - t_{elap} \right)$$

where $t_r$ is the extant battery life value, ϕ is said dominating parameter, α and ζ are further parameters, $V_{low}$ is a battery voltage indicative of the battery approaching an empty state, $t_{elap}$ is said elapsed time value, and said model relates battery voltage to discharge time at constant current thus:

$$V_b = \phi - \zeta \alpha^{t_{elap}}.$$

43. A mobile phone comprising a battery, a memory storing a set of default parameter values appropriate for calculating a total life estimate of a reference battery according to an algorithm and processing means programmed to estimate the extant life of said battery of the apparatus by scaling at least one of said parameter values in dependence on the capacity of said battery of the apparatus and calculating a total life estimate for said battery of the apparatus using the or each scaled parameter value and said algorithm, wherein said process comprises initially determining whether it is being run for a first time since the mobile phone was powered up and, if so, setting the value of at least one of said parameters in dependence on the capacity of the battery.

44. A mobile phone according to claim 43, wherein said battery of the apparatus includes means identifying its capacity and the processing means comprises means for determining the capacity of said battery from said capacity identifying means.

45. A mobile phone according to claim 44, wherein the processing means is programmed to implement said algorithm by calculating said total life estimate for the battery of the apparatus using the formula:

$$\frac{\ln\left(\frac{\varphi - V_{low}}{\zeta}\right)}{\ln \alpha}$$

where $\varphi$, $\zeta$ and $\alpha$ constitute parameters for which said default values are stored in the memory and $V_{low}$ is a battery voltage indicative of the battery of the apparatus approaching an empty state.

46. A mobile phone according to claim 45, wherein the battery is a Li-ion battery and the processing means is programmed to scale the parameter $\alpha$ according the capacity of the battery by implementing the formula:

$$\alpha = \left[(\alpha_{default} - 1) \cdot \frac{C_{default}}{C_{new}}\right] + 1$$

where $C_{default}$ is the capacity of the reference battery and $C_{new}$ and the value of $\alpha_{default}$ being one of said default parameter values stored in the memory.

47. A mobile phone according to claim 45, wherein the battery is a NiMH battery and the processing means is programmed to scale the parameter $\alpha$ according the capacity of the battery by implementing the formula:

$$\alpha = \left[(\alpha_{default} - 1) \cdot \frac{C_{default}}{C_{new}(1 + Y)}\right] + 1$$

where $C_{default}$ is the capacity of the reference battery and $C_{new}$ and the value of $\alpha_{default}$ being one of said default parameter values stored in the memory.

48. A mobile phone according to claim 43, wherein said process comprises determining whether the mobile phone is in standby mode and, if so, performing a first routine otherwise performing a second routine.

49. A mobile phone according to claim 48, wherein the first routine comprises:
updating $t_{elap}$;
determining that the battery is neither low nor high;
calculating $\Delta\varphi$ where $\Delta\varphi = V_b + \zeta\alpha^{t_{elap}} - \varphi$;
determining whether this is the first time that standby mode has been entered and, if so,
updating said parameters according to $$\varphi_{new} = \varphi_{old} + 0.1\Delta\varphi$$

$$\alpha_{new} = \alpha_{old} - \Delta\varphi\left[\frac{\alpha_0 - 1}{\varphi_0}\right] \cdot 2$$

-continued $$\zeta_{new} = \zeta_{old} + \Delta\varphi\left[\frac{\zeta_0}{\varphi_0}\right] \cdot 2$$

else
determining whether $\Delta\varphi$ is greater then $\Delta\varphi_{acceptable}$ and, if so
updating said parameters according to $$\varphi_{new} = \varphi_{old} + \left[\Delta\varphi - \frac{|\Delta\varphi|}{\Delta\varphi} \cdot \Delta\varphi_{acceptable}\right] \cdot \mu_\varphi$$

$$\alpha_{new} = \alpha_{old} - \Delta\varphi \cdot \mu_\alpha$$

$$\zeta_{new} = \zeta_{old} - \Delta\varphi \cdot \mu_\zeta;$$

and
calculating $t_r$,
wherein $\Delta\varphi_{acceptable}$ and $\mu_\varphi$ are predetermined and $\mu_\zeta$ and $\mu_\alpha$ are set according to $$\mu_\alpha = \left(\frac{\alpha_0 - 1}{\varphi_0}\right) \cdot 0.5$$

$$\mu_\zeta = \left(\frac{\zeta_0}{\varphi_0}\right) \cdot 0.5.$$

50. A mobile phone according to claim 48, wherein the second routine comprises:
determining whether the battery voltage indicated a full battery when last measured and, if so
estimating the prevailing load current on the basis of the current communication protocol;
estimating the equivalent standby battery voltage for the present value of $t_{elap}$;
determining whether said equivalent standby battery voltage indicates a full battery and, if not:
updating updating $\varphi$ according to $\varphi_{new} = \varphi_{old} + 0.5\Delta\varphi$ with $\Delta\varphi$ being derived using the equivalent standby battery voltage;
else
estimating the load current according to $$I_{load} = \frac{[\varphi + \zeta\alpha^{t_{elap}}] - V_b}{R_b}$$

where $R_b$ is an approximate value for the resistance of the battery and $V_b$ is the measured battery voltage;
calculating a value for said elapsed time value by calculating an incremental elapsed time value according to $$\Delta t_{elap} = \left(1 + \frac{I_{load}}{I_{min\_stby}}\right) \cdot \Delta t_{elap\_measured}$$

where $I_{min\_stby}$ is the minimum expected standby current;
calculating $t_r$.

51. A mobile phone including a battery, a voltage sensor for measuring the voltage of the battery and a processor configured to control the mobile phone for operation in a standby mode and in a non-standby mode, the processor being further configured to estimate the extant life of said battery in said standby mode by an extant battery life estimating process comprising:

using a battery voltage value, derived from the voltage measured by said sensor, and a battery discharge elapsed time value to determine whether the value of a dominating parameter of a function, derived from a model of a substantial part of the discharging of a battery, meets a fitness criterion; and if the value of said dominating parameter fails to meet said fitness criterion, modifying said dominating parameter's value in a predetermined manner and calculating an estimate of extant battery life using said function, wherein said function is of the form:

$$t_r = \left( \frac{\ln \frac{\varphi - V_{low}}{\zeta}}{\ln \alpha} - t_{elap} \right)$$

where $t_r$ is the extant battery life value, $\phi$ is said dominating parameter, $\alpha$ and $\zeta$ are further parameters, $V_{low}$ is a battery voltage indicative of the battery approaching an empty state, $t_{elap}$ is said elapsed time value, and said model relates battery voltage to discharge time at constant current thus:

$$V_b = \phi - \zeta \alpha^{t_{elap}}, \text{ and}$$

said process comprises initially determining whether it is being run for a first time since the mobile phone was powered up and, if so, setting the value of at least one of said parameters in dependence on the capacity of the battery.

52. A mobile phone according to claim 51, wherein said process comprises determining whether the mobile phone is in standby mode and, if so, performing a first routine otherwise performing a second routine.

53. A mobile phone according to claim 52, wherein the first routine comprises:
    updating $t_{elap}$;
    determining that the battery is neither low nor high;
    calculating $\Delta\phi$ where $\Delta\phi = V_b + \zeta\alpha^{t_{elap}} - \phi$;
    determining whether this is the first time that standby mode has been entered and, if so,
    updating said parameters according to $$\varphi_{new} = \varphi_{old} + 0.1\Delta\varphi$$

$$\alpha_{new} = \alpha_{old} - \Delta\varphi\left[\frac{\alpha_0 - 1}{\varphi_0}\right] \cdot 2$$

$$\zeta_{new} = \zeta_{old} + \Delta\varphi\left[\frac{\zeta_0}{\varphi_0}\right] \cdot 2$$

else
    determining whether $\Delta\phi$ is greater then $\Delta\phi_{acceptable}$ and, if so
    updating said parameters according to $$\varphi_{new} = \varphi_{old} + \left[\Delta\varphi - \frac{|\Delta\varphi|}{\Delta\varphi} \cdot \Delta\varphi_{acceptable}\right] \cdot \mu_\varphi$$

$$\alpha_{new} = \alpha_{old} - \Delta\varphi \cdot \mu_\alpha$$

$$\zeta_{new} = \zeta_{old} - \Delta\varphi \cdot \mu_\zeta;$$

and
    calculating $t_r$,
    wherein $\Delta\phi_{acceptable}$ and $\mu_\phi$ are predetermined and $\mu_\zeta$ and $\mu_\alpha$ are set according $$\mu_\alpha = \left(\frac{\alpha_0 - 1}{\varphi_0}\right) \cdot 0.5$$

$$\mu_\zeta = \left(\frac{\zeta_0}{\varphi_0}\right) \cdot 0.5.$$

54. A mobile phone according to claim 52, wherein the second routine comprises:
    determining whether the battery voltage indicated a full battery when last measured and, if so
        estimating the prevailing load current on the basis of the current communication protocol;
        estimating the equivalent standby battery voltage for the present value of $t_{elap}$;
        determining whether said equivalent standby battery voltage indicates a full battery and, if not:
            updating updating $\phi$ according to $\phi_{new} = \phi_{old} + 0.5 \Delta\phi$ with $\Delta\phi$ being derived using the equivalent standby battery voltage;
    else
        estimating the load current according to $$I_{load} = \frac{[\varphi + \zeta\alpha^{t_{elap}}] - V_b}{R_b}$$

where $R_b$ is an approximate value for the resistance of the battery and $V_b$ is the measured battery voltage;
calculating a value for said elapsed time value by calculating an incremental elapsed time value according to $$\Delta t_{elap} = \left(1 + \frac{I_{load}}{I_{\min\_stby}}\right) \cdot \Delta t_{elap\_measured}$$

where $I_{min\_stby}$ is the minimum expected standby current;
calculating $t_r$.

55. A mobile phone comprising a battery and processing means configured for calculating an extant battery life estimate for the battery using a battery discharge model, wherein the product of the use of said model is scaled by the processing means in dependence on a current demand value for the apparatus, wherein the processor is configured to control the mobile phone to operate according to a plurality of communication protocols and said process comprises initially determining whether it is being run for a first time since the mobile phone was powered up and, if so, setting the value of the parameter by scaling a default value according to the expected standby current demand for the communication protocol currently being used.

56. A mobile phone according to claim 55, wherein the model is of the form:

$$\frac{\ln\left(\frac{\varphi - V_{low}}{\zeta}\right)}{\ln \alpha}$$

and the processing means is programmed with default values for $\phi$, $\zeta$, $\alpha$ and $V_{low}$ and the value for $\alpha$ used is derived from the programmed default value for $\alpha$ in dependence on said current demand value, and $V_{low}$ is a battery voltage indicative of the battery of the apparatus approaching an empty state.

57. An mobile phone according to claim 56, wherein the battery is a Li-ion battery and the value of the parameter α used is determined according to the formula:

$$\alpha = \left[(\alpha_{default} - 1) \cdot \frac{I_{exp}}{I_{default}}\right] + 1$$

where $I_{exp}$ is said apparatus dependent current value and $I_{default}$ is the respective discharge current for which the parameter values, programmed into the or each apparatus, were determined.

58. An mobile phone according to claim 56, wherein the battery is a NiMH battery and the value of the parameter α used is determined according to the formula:

$$\alpha = \left[(\alpha_{default} - 1) \cdot \frac{I_{exp}}{I_{default} \cdot (1 - X)}\right] + 1$$

where $I_{exp}$ is said apparatus dependent current value and $I_{default}$ is the respective discharge current for which the parameter values, programmed into the or each apparatus, were determined.

59. An mobile phone according to claim 58, wherein X is about 0.05.

60. A mobile phone according to claim 55, wherein said process comprises determining whether the mobile phone is in standby mode and, if so, performing a first routine otherwise performing a second routine.

61. A mobile phone according to claim 55, wherein the first routine comprises:

updating $t_{elap}$;
determining that the battery is neither low nor high;
calculating Δφ where $\Delta\phi = V_b + \zeta\alpha^{t_{elap}} - \phi$;
determining whether this is the first time that standby mode has been entered and, if so,
updating said parameters according to $$\varphi_{new} = \varphi_{old} + 0.1\Delta\varphi$$
$$\alpha_{new} = \alpha_{old} - \Delta\varphi\left[\frac{\alpha_0 - 1}{\varphi_0}\right] \cdot 2$$
$$\zeta_{new} = \zeta_{old} + \Delta\varphi\left[\frac{\zeta_0}{\varphi_0}\right] \cdot 2$$

else
determining whether Δφ is greater then $\Delta\phi_{acceptable}$ and, if so
updating said parameters according to $$\varphi_{new} = \varphi_{old} + \left[\Delta\varphi - \frac{|\Delta\varphi|}{\Delta\varphi} \cdot \Delta\varphi_{acceptable}\right] \cdot \mu_\varphi$$
$$\alpha_{new} = \alpha_{old} - \Delta\varphi \cdot \mu_\alpha$$
$$\zeta_{new} = \zeta_{old} - \Delta\varphi \cdot \mu_\zeta;$$

and
calculating $t_r$,
wherein $\Delta\phi_{acceptable}$ and $\mu_\phi$ are predetermined and $\mu_\zeta$ and $\mu_\alpha$ are set according to $$\mu_\alpha = \left(\frac{\alpha_0 - 1}{\varphi_0}\right) \cdot 0.5$$

$$\mu_\zeta = \left(\frac{\zeta_0}{\varphi_0}\right) \cdot 0.5.$$

62. A mobile phone according to claim 55, wherein the second routine comprises:

determining whether the battery voltage indicated a full battery when last measured and, if so
  estimating the prevailing load current on the basis of the current communication protocol;
  estimating the equivalent standby battery voltage for the present value of $t_{elap}$;
  determining whether said equivalent standby battery voltage indicates a full battery and, if not:
    updating updating φ according to $\phi_{new} = \phi_{old} + 0.5\Delta\phi$ with Δφ being derived using the equivalent standby battery voltage;
else
estimating the load current according to $$I_{load} = \frac{[\varphi + \zeta\alpha^{t_{elap}}] - V_b}{R_b}$$

where $R_b$ is an
approximate value for the resistance of the battery and $V_b$ is the measured battery voltage;
calculating a value for said elapsed time value by calculating an incremental elapsed time value according to $$\Delta t_{elap} = \left(1 + \frac{I_{load}}{I_{min\_stby}}\right) \cdot \Delta t_{elap\_measured}$$

where $I_{min\_stby}$ is the minimum expected standby current;
calculating $t_r$.

63. A mobile phone including a battery, a voltage sensor for measuring the voltage of the battery and a processor configured to control the mobile phone for operation in a standby mode and in a non-standby mode, the processor being further configured to estimate the extant life of said battery in said standby mode by an extant battery life estimating process comprising:

using a battery voltage value, derived from the voltage measured by said sensor, and a battery discharge elapsed time value to determine whether the value of a dominating parameter of a function, derived from a model of a substantial part of the discharging of a battery, meets a fitness criterion; and if the value of said dominating parameter fails to meet said fitness criterion, modifying said dominating parameter's value in a predetermined manner and calculating an estimate of extant battery life using said function,
wherein said function is of the form:

$$t_r = \left(\frac{\ln\frac{\varphi - V_{low}}{\zeta}}{\ln \alpha} - t_{elap}\right)$$

where $t_r$ is the extant battery life value, φ is said dominating parameter, α and ζ are further parameters, $V_{low}$ is a battery voltage indicative of the battery approaching an empty state, $t_{elap}$ is said elapsed time value, and said model relates battery voltage to discharge time at constant current thus:

$$V_b = \phi - \zeta \alpha^{t_{elap}}, \text{ and} \qquad 5$$

the processor is configured to control the mobile phone to operate according to a plurality of communication protocols and said process comprises initially determining whether it is being run for a first time since the mobile phone was powered up and, if so, setting the value of the parameter by scaling a default value according to the expected standby current demand for the communication protocol currently being used.

64. A mobile phone according to claim 63, wherein the first routine comprises:

updating $t_{elap}$;
determining that the battery is neither low nor high;
calculating $\Delta\phi$ where $\Delta\phi V_b + \zeta\alpha^{t_{elap}} - \phi$;
determining whether this is the first time that standby mode has been entered and, if so,
updating said parameters according to $$\varphi_{new} = \varphi_{old} + 0.1\Delta\varphi$$

$$\alpha_{new} = \alpha_{old} - \Delta\varphi \left[\frac{\alpha_0 - 1}{\varphi_0}\right] \cdot 2$$

$$\zeta_{new} = \zeta_{old} + \Delta\varphi \left[\frac{\zeta_0}{\varphi_0}\right] \cdot 2$$

else
determining whether $\Delta\phi$ is greater then $\Delta\phi_{acceptable}$ and, if so
updating said parameters according to $$\varphi_{new} = \varphi_{old} + \left[\Delta\varphi - \frac{|\Delta\varphi|}{\Delta\varphi} \cdot \Delta\varphi_{acceptable}\right] \cdot \mu_\varphi$$

$$\alpha_{new} = \alpha_{old} - \Delta\varphi \cdot \mu_\alpha$$

$$\zeta_{new} = \zeta_{old} - \Delta\varphi \cdot \mu_\zeta;$$

and
calculating $t_r$,
wherein $\Delta\phi_{acceptable}$ and $\mu_\phi$ are predetermined and $\mu_\zeta$ and $\mu_\alpha$ are set according to $$\mu_\alpha = \left(\frac{\alpha_0 - 1}{\varphi_0}\right) \cdot 0.5$$

$$\mu_\zeta = \left(\frac{\zeta_0}{\varphi_0}\right) \cdot 0.5.$$

65. A mobile phone according to claim 63, wherein the second routine comprises:

determining whether the battery voltage indicated a full battery when last measured and, if so
estimating the prevailing load current on the basis of the current communication protocol;
estimating the equivalent standby battery voltage for the present value of $t_{elap}$;
determining whether said equivalent standby battery voltage indicates a full battery and, if not:
updating updating $\phi$ according to $\phi_{new} = \phi_{old} + 0.5\Delta\phi$ with $\Delta\phi$ being derived using the equivalent standby battery voltage;

else
estimating the load current according to $$I_{load} = \frac{[\varphi + \zeta\alpha^{t_{elap}}] - V_b}{R_b}$$

where $R_b$ is an approximate value for the resistance of the battery and $V_b$ is the measured battery voltage;
calculating a value for said elapsed time value by calculating an incremental elapsed time value according to $$\Delta t_{elap} = \left(1 + \frac{I_{load}}{I_{min\_stby}}\right) \cdot \Delta t_{elap\_measured}$$

where $I_{min\_stby}$ is the minimum expected standby current;
calculating $t_r$.

\* \* \* \* \*